(12) United States Patent
Huang

(10) Patent No.: US 7,476,855 B2
(45) Date of Patent: Jan. 13, 2009

(54) BEAM TUNING WITH AUTOMATIC MAGNET POLE ROTATION FOR ION IMPLANTERS

(75) Inventor: Yongzhang Huang, Hamilton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 238 days.

(21) Appl. No.: 11/523,144

(22) Filed: Sep. 19, 2006

(65) Prior Publication Data

US 2008/0067435 A1    Mar. 20, 2008

(51) Int. Cl.
- H01J 37/137 (2006.01)
- H01J 37/30 (2006.01)
- H01J 49/20 (2006.01)
- H01J 49/30 (2006.01)
- H01J 37/304 (2006.01)

(52) U.S. Cl. .......... 250/298; 250/294; 250/396 R; 250/492.21

(58) Field of Classification Search .......... 250/281, 250/282, 294, 295, 298, 299, 396 R, 396 ML, 250/397, 398, 492.1, 492.2, 492.3, 492.21
See application file for complete search history.

(56) References Cited

U.S. PATENT DOCUMENTS

| | | | | |
|---|---|---|---|---|
| 3,783,278 A | * | 1/1974 | Cambey | 250/299 |
| 4,524,275 A | * | 6/1985 | Cottrell et al. | 250/298 |
| 4,757,208 A | * | 7/1988 | McKenna et al. | 250/492.2 |
| 5,311,028 A | * | 5/1994 | Glavish | 250/492.21 |
| 5,393,984 A | * | 2/1995 | Glavish | 250/396 ML |
| 5,438,203 A | * | 8/1995 | Glavish et al. | 250/396 ML |
| 5,483,077 A | * | 1/1996 | Glavish | 250/492.2 |
| 6,403,972 B1 | | 6/2002 | Cucchetti et al. | |
| 2008/0067435 A1 | * | 3/2008 | Huang | 250/492.21 |

* cited by examiner

Primary Examiner—Bernard E Souw
(74) Attorney, Agent, or Firm—Eschweiler & Associates, LLC

(57) ABSTRACT

An ion implantation apparatus, system, and method for controlling an ion beam, wherein a mass analyzer generally positioned between an ion source and an end station is configured to selectively control a path of a desired ion beam. The mass analyzer comprises one or more of an entrance pole mechanism positionable proximate to an entrance of the mass analyzer and an exit pole mechanism positionable proximate to an exit of the mass analyzer, wherein the position of the entrance pole mechanism and exit pole mechanism generally determines the path and focal point of the desired ion beam. A controller is configured to selectively position one or more of the entrance pole mechanism and exit pole mechanism, therein generally controlling the path of the desired ion beam at the exit of the mass analyzer, wherein the control may be based on one or more detected characteristics of the desired ion beam.

29 Claims, 8 Drawing Sheets

BEAM TUNING WITH AUTOMATIC MAGNET POLE ROTATION FOR ION IMPLANTERS

FIELD OF THE INVENTION

The present invention relates generally to ion implantation systems and methods for implanting ions into a workpiece, and more specifically to a system and method for tuning an ion beam.

BACKGROUND OF THE INVENTION

In the semiconductor industry, ion implantation systems are typically employed to dope a workpiece with impurities. In such systems, an ion source ionizes a desired dopant element, wherein ions are generally extracted from the ion source in the form of an undifferentiated ion beam. The undifferentiated ion beam is typically directed into a beamline assembly comprising a mass analysis apparatus or mass analyzer, wherein ions of a desired charge-to-mass ratio are selected using magnetic fields. Mass analyzers typically employ a mass analysis magnet (also called an AMU magnet) to create a dipole magnetic field, wherein various ions in an ion beam are deflected via magnetic deflection in an arcuate passageway that effectively separates ions of different charge-to-mass ratios. The mass of an ion relative to the charge thereon (i.e., the charge-to-mass ratio) affects the degree to which it is accelerated both axially and transversely by an electrostatic or magnetic field. Therefore, the selected or desired ion beam can be made very pure, since ions of undesirable molecular weight will be deflected to positions away from the beam. The process of selectively separating ions of desired and undesired charge-to-mass ratios is known as mass analysis.

The selected or desired ions are then directed at a surface of the workpiece positioned in a target chamber, wherein the workpiece, (e.g., a semiconductor wafer) is generally implanted with the dopant element. Accordingly, the ions of the desired ion beam penetrate the surface of the workpiece to form a region having a desired characteristic, such as a desired electrical conductivity useful in the fabrication of transistor devices.

The ion beam may be a spot beam (e.g., a pencil beam), wherein the workpiece is mechanically scanned in two dimensions orthogonal to the generally stationary spot beam; a ribbon beam, wherein the beam is formed or electromagnetically scanned in one direction across the workpiece while the workpiece is mechanically scanned in an orthogonal direction; or an electromagnetically scanned beam that is electromagnetically scanned in two directions across a stationary workpiece. Examples of ion implantation systems include those available from Axcelis Technologies of Beverly, Mass.

The ion beam may be further focused and directed in front of the desired surface region of the workpiece in the target station, wherein the energetic ions of the ion beam may be accelerated or decelerated to a predetermined energy level to properly penetrate into the workpiece. The ions, for example, are embedded into a crystalline lattice of the material to form the region of desired conductivity, with the energy of the ion beam generally determining the depth of implantation.

In the semiconductor industry, workpieces are commonly implanted with ions via so-called high current and/or low current ion implanters. In high current implanters, for instance, ion beams having a high beam current ranging between tens of KeV to lower hundreds of eV are commonly provided. In such high current implanters, the ion beam is typically difficult to focus due to the space charge of the low energy associated therewith. One solution has been to provide an additional focusing force through the use of optics associated with the extraction of ions from the ion source. However, the use of ion source extraction optics, alone, has proved to be insufficient in providing the necessary focusing force for the high current ion beam along the entire beamline, and additional focusing is typically needed to achieve an acceptable ion implantation. Furthermore, high current ion implanters typically operate in a deceleration mode with an energy filter, wherein the AMU magnet is "de-tuned", thus resulting in a shifting of the optical focal point of the ion beam.

Thus, it is desirable to provide an apparatus and method for controlling the focal point of the ion beam, in order to return the focal point of the ion beam to its original position.

SUMMARY OF THE INVENTION

The present invention overcomes the limitations of the prior art by providing an apparatus and method for controlling a focal point of an ion implanter by controlling a movement of magnetic poles associated with the ion implanter. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward ion implantation systems, and more particularly, to a mass analyzer having controllable entrance and exit magnetic poles. In accordance with one exemplary aspect of the invention, an ion source is configured to form a beam of undifferentiated ions, wherein the beam of ions is generally directed into a mass analyzer positioned between the ion source and an end station having a workpiece provided therein. The mass analyzer, for example, is configured to select a desired beam of ions having a path associated therewith. In accordance with one aspect of the invention, the undifferentiated beam of ions generally enters the mass analyzer at an entrance thereof, wherein the mass analyzer comprises an entrance pole mechanism rotatably positioned proximate to the entrance. The desired ion beam exits the mass analyzer at an exit thereof, and wherein the mass analyzer further comprises an exit pole mechanism rotatably positioned proximate to the exit. A rotational position of one or more of the entrance pole mechanism and exit pole mechanism, for example, generally controls a focusing force of the ion beam, thus affecting the path of the desired ion beam.

According to one example, the entrance pole mechanism comprises a generally magnetic entrance member rotatable about an entrance axis associated with the entrance of the mass analyzer, and the exit pole mechanism comprises a generally magnetic exit member rotatable about an exit axis associated with the exit of the mass analyzer. Each of the entrance member and exit member, for example, further comprise a pole edge rotatable about the respective entrance axis and exit axis, wherein a rotation of the entrance member and exit member (and thus, the associated pole edges of each magnetic member) about the respective entrance axis and exit axis generally affects the path of the desired ion beam at the exit of the mass analyzer.

In accordance with another exemplary aspect, a controller is further provided, wherein the controller is configured to selectively rotate one or more of the entrance member and exit member, therein generally controlling the path of the desired ion beam at the exit of the mass analyzer. The control may be based, for example, on a sensed position or a calculated position of the ion beam downstream of the mass analyzer. Alternatively, the rotation of the entrance member and exit member can be performed manually.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
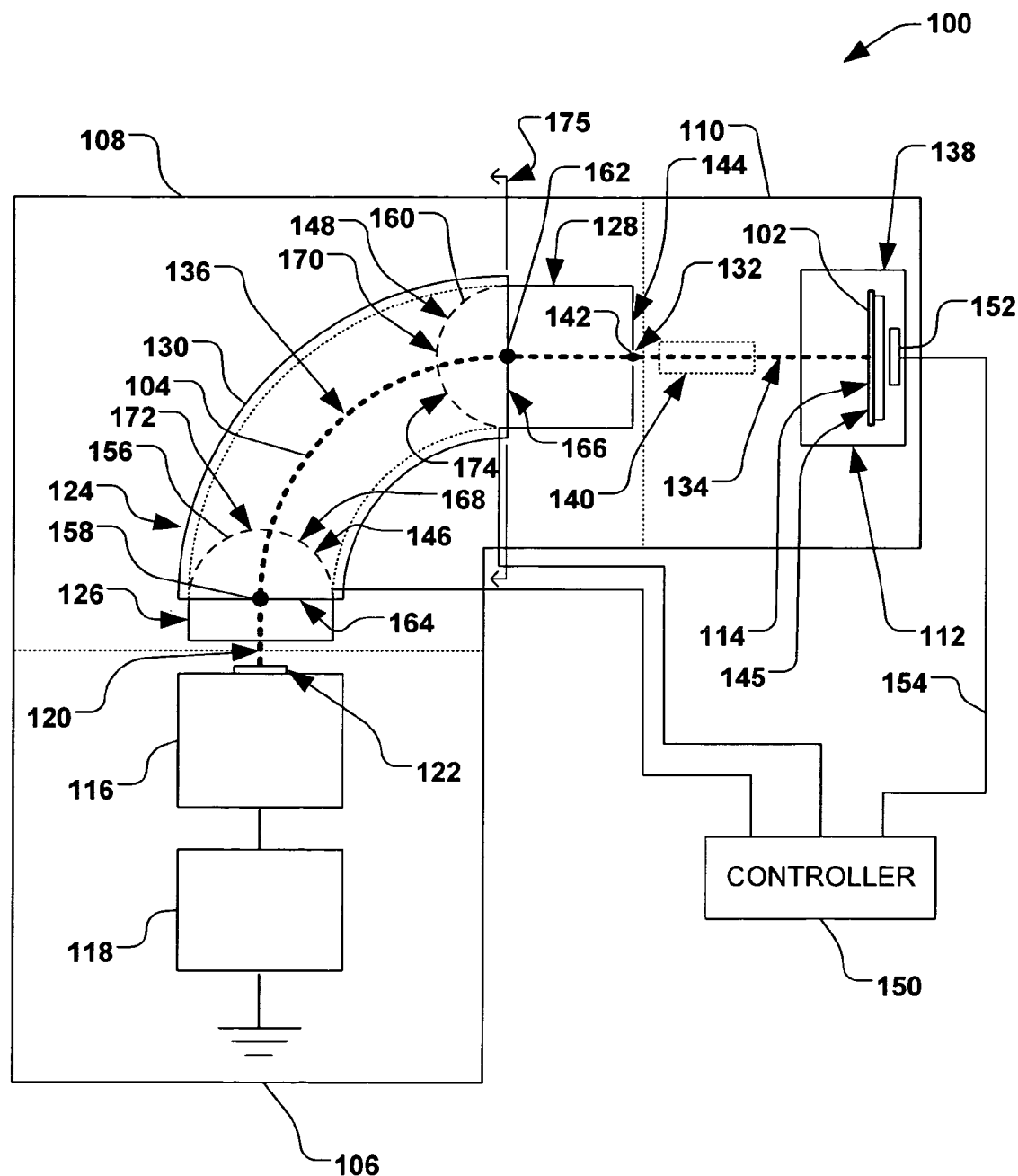
FIG. 1 illustrates an exemplary ion implantation system in accordance with one aspect of the present invention.

The present invention is directed generally toward an ion implantation system and method for controlling a path and/or focal point of an ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer) relative to an ion beam 104, therein implanting ions into the workpiece. As stated above, various aspects of the present invention may be implemented in association with any type of ion implantation apparatus, including, but not limited to, the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. an ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example the desired ion beam 134 is directed to the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, and fall within the scope of the present invention. For example, the system 100 may comprise an electrostatic beam scanning system (not shown) operable to scan the ion beam 104 along one or more scan planes relative to the workpiece 102. Accordingly, the present invention contemplates any scanned or non-scanned ion beams 104 as falling within the scope of the present invention.

The ion implantation system 100 of the present invention may be configured to provide the desired ion beam 134 as having a high energy (e.g., a current of the desired ion beam ranging between tens of KeV to lower hundreds of eV) or a low energy (e.g., the current of the desired ion beam ranging less than high energy beams) associated therewith. In an ion implantation system 100 (e.g., alternative referred to as an "implanter") having a low energy associated with the desired ion beam 134, space charges associated the low energy of the beam may necessitate additional focusing of the ion beam via optics (not shown) associated with the extraction of ions from the ion source 116. The ion implantation system 100 may be further configured to operate in an acceleration or deceleration mode, wherein the system may further comprise an energy filter and/or decelerator 140. For example, the mass analyzer 130 is generally "de-tuned", wherein an optical focal point 142 is shifted from a plane 144 associated with the resolving aperture 132, and wherein the desired ion beam 134 is further passed through the energy filter 140 (e.g., a "decel" and accompanying energy filter), wherein the ions of the desired ion beam are accelerated or decelerated, thus resulting in a shifting of the position of the ion beam at a plane 145 associated with the workpiece 102.

In order to provide improved focusing of the ion beam 104 (e.g., focusing of the desired ion beam 134 at the plane 144), the present invention further provides one or more of an entrance pole mechanism 146 and an exit pole mechanism 148 associated with the mass analyzer 130, wherein the entrance pole mechanism and/or exit pole mechanism are operable to control and/or augment the focal point 142 of the desired ion beam based on a respective position thereof with respect to the mass analyzer. In the present example, the entrance pole mechanism 146 is rotatably positioned proximate to the entrance 126 of the mass analyzer 130, and the exit pole mechanism 148 is rotatably positioned proximate to the exit 128 of the mass analyzer, wherein the rotational position of the entrance pole mechanism and exit pole mechanism generally affects the path 136 of the desired ion beam 134. It should be noted, however, that the entrance pole mechanism 146 and exit pole mechanism 148 can be positioned with respect to the mass analyzer 130 in a variety of ways, such as a linear translation generally along the path 136 of the ion beam 104, and all such positioning of one or more of the entrance pole mechanism and exit pole mechanism is contemplated as falling within the scope of the present invention. A controller 150, for example, is further provided and configured to selectively position one or more of the entrance pole mechanism 146 and exit pole mechanism 148, therein generally controlling the path 136 of the desired ion beam 134 at the exit 128 of the mass analyzer 130.

In accordance with one exemplary aspect of the present invention, the ion implantation system 100 further comprises a detection device 152 (e.g., a Faraday cup) associated with the path 136 of the desired ion beam 134, wherein the detection device is configured to detect one or more characteristics 154 of the desired ion beam. The controller 150, for example, is further configured to selectively position one or more of the entrance pole mechanism 146 and exit pole mechanism 148 based, at least in part, on the detected one or more characteristics 154 of the desired ion beam 134. The one or more characteristics 154 of the desired ion beam 134 may comprise one or more of a position of the desired ion beam 134 (e.g., a focal point of the beam) and a current of the desired ion beam. According to another example, the detection device 152 may be configured to generally translate through the path 136 of the desired ion beam 134, therein generally detecting the position of the desired ion beam. Alternatively, the detection device 152 may comprise a generally stationary Faraday cup positioned along the path 136 of the desired ion beam 134 (e.g., near the plane 145 of the workpiece 102).

According to another exemplary aspect of the invention, the entrance pole mechanism 146 and the exit pole mechanism 148 respectively comprise an a generally magnetic entrance member 156 positionable about an entrance axis 158 and a generally magnetic exit member 160 positionable about an exit axis 162. Each of the entrance member 156 and exit member 160, for example, respectively comprise a pole edge 164 and 166 positionable with respect to the respective entrance axis 158 and exit axis 162. For example, a rotational position of the entrance member 156 and exit member 160 with respect to the respective entrance axis 158 and exit axis 162 generally defines the path 136 of the desired ion beam 134 via the relative angles made by the respective pole edges and the mass analyzer 130. In the present example, the mass analyzer 130 further comprises an entrance radius 168 and an exit radius 170, and wherein each of the entrance member 156 and exit member 160 further comprise a respective radius edge 172 and 174 generally opposite the respective pole edge 164 and 166, wherein the radius edge of the entrance member and exit member is associated with the respective entrance radius and exit radius of the mass analyzer, as will be discussed infra. One or more of the entrance member 156 and exit member 160, for example, are generally semicircular in shape, as illustrated in FIG. 1.

Figure 2:
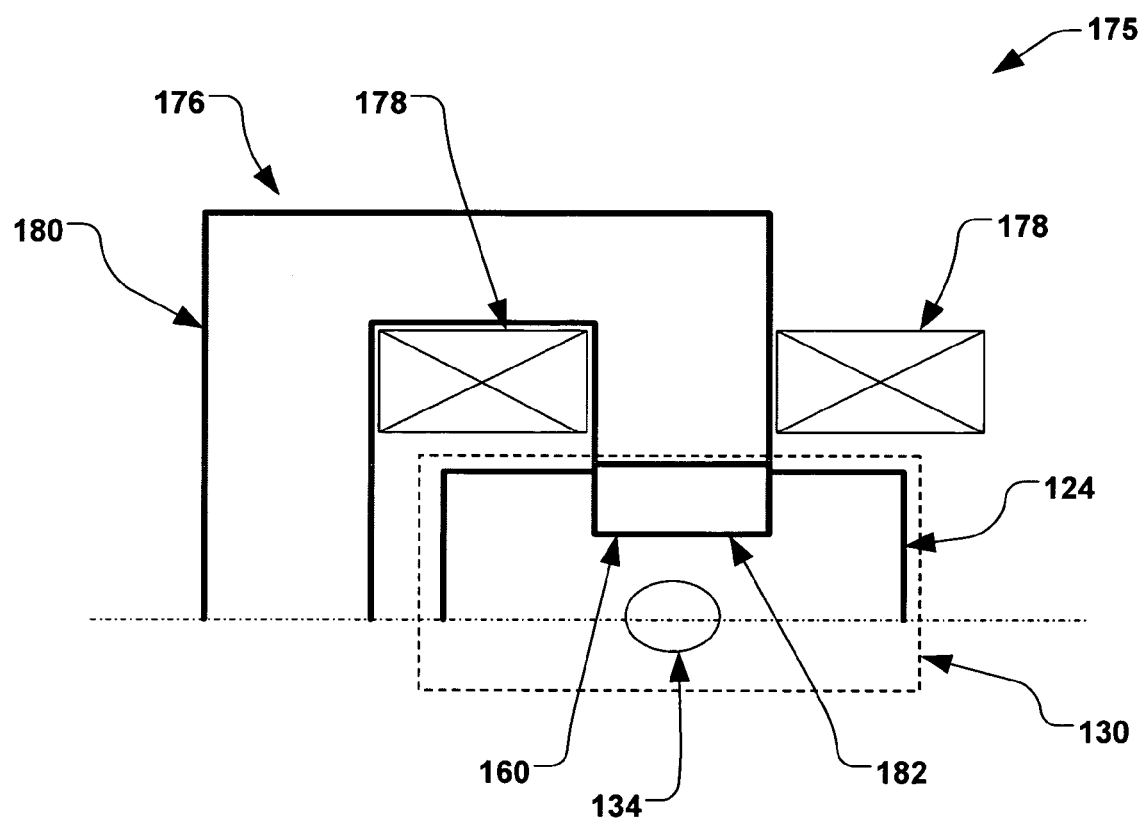
FIG. 2 illustrates a simplified partial cross sectional representation of a dipole magnetic structure and beamline assembly according to another aspect of the invention.

FIG. 2 is a simplified partial cross sectional representation of a portion 175 of the beamline assembly 108 of FIG. 1 (e.g., the ion beam 134 extends out of the page toward the viewer). As seen in FIG. 2, the beamguide 124 is generally integral to a magnet 176, wherein the magnet is generally comprised of a coil 178, a yoke 180, and a magnetic pole apparatus 182 (e.g., also referred to as a magnetic pole). The magnetic pole 182, for example, comprises the exit member 160, the entrance member (not shown in FIG. 2), and a central member (not shown) disposed therebetween, as will be further discussed hereafter.

Figure 3:
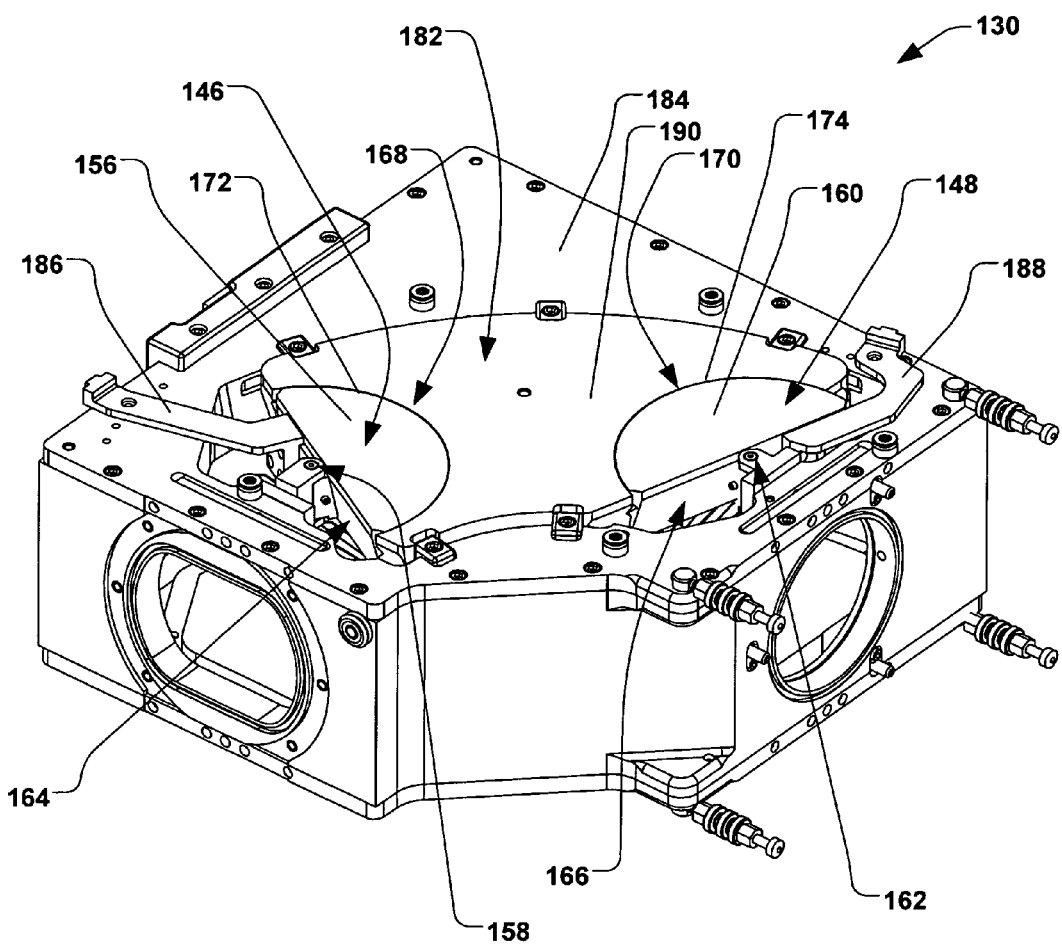
FIG. 3 is a perspective view of an exemplary beamguide assembly with magnet poles of FIG. 2 according to another aspect of the present invention.

FIG. 3 illustrates a perspective view of the exemplary beamguide 124 and magnetic pole 182 of FIG. 2 in greater detail, wherein further exemplary aspects of the present invention can be appreciated. In FIG. 3, the entrance pole mechanism 146 and the exit pole mechanism 148 are illustrated, wherein the respective entrance member 156 and exit member 160 are rotatably coupled to a body 184 of the beamguide 124 via a respective entrance linkage 186 and exit linkage 188. The entrance linkage 186 and exit linkage 188, for example, are configured to rotate the respective entrance member 156 and exit member 160 about the respective entrance axis 158 and exit axis 162 via a respective application of force thereto. Thus, the pole edges 164 and 166 are rotatable about the respective entrance axis 158 and exit axis 162, therein steering the path 136 of the ion beam 104 illustrated in FIG. 1. One or more servo motors or other force-producing mechanisms (not shown) may be further operably coupled to one or more of the entrance linkage 186 and exit linkage 188, wherein controlled rotation of the entrance member 156 and exit member 160 may be attained. For example, the controller 150 of FIG. 1 may be further configured to selectively position (e.g., rotate or translate) one or more of the entrance member 156 and exit member 160 (e.g., by controlling the motor(s) coupled to the entrance linkage 186 and exit linkage 188), therein generally controlling the path 136 of the desired ion beam 134.

Figure 4:
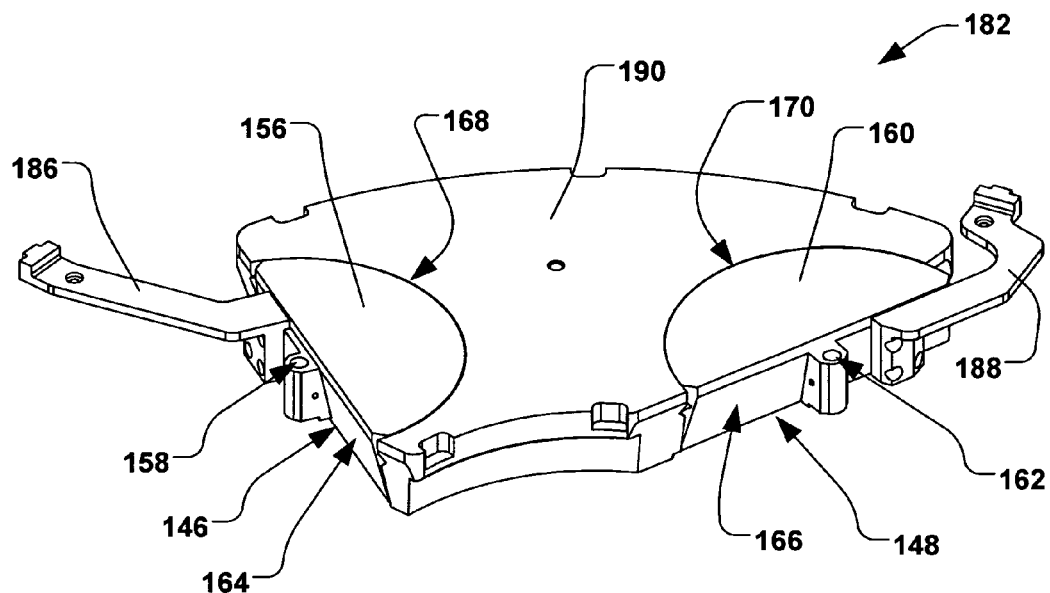
FIG. 4 illustrates a perspective view of an exemplary magnetic pole apparatus in accordance with yet another exemplary aspect of the invention.
Figure 5:
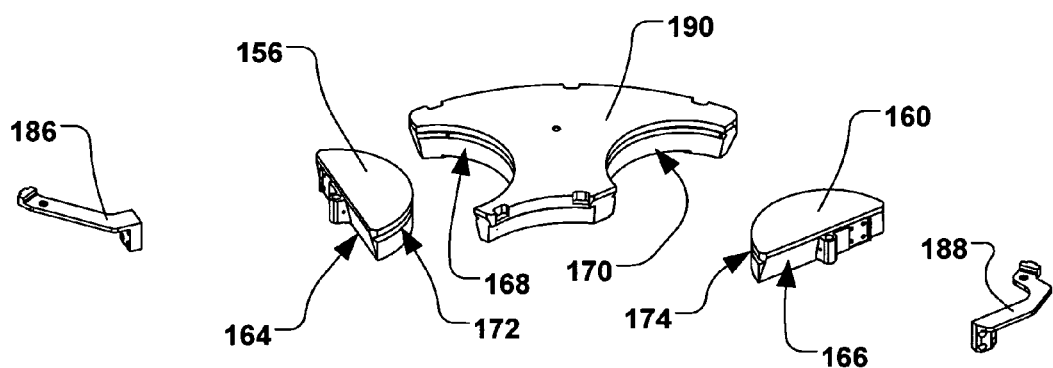
FIG. 5 illustrates a blown-up perspective view of the magnetic pole apparatus of FIG. 4 in accordance with still another aspect of the invention.

FIG. 4 illustrates the exemplary magnetic pole apparatus 182 discussed above, wherein the magnetic pole apparatus comprises the exemplary entrance pole mechanism 146 and the exit pole mechanism 148 of FIGS. 1 and 3. The magnetic pole apparatus 182 discussed above, for example, may be defined, at least in part, by the entrance member 156, the exit member 160, and a central member 190 of the magnetic pole apparatus, as illustrated in FIG. 4 (and further illustrated in an exploded view in FIG. 5), wherein the entrance radius 168 and an exit radius 170 of the mass analyzer 130 are generally defined within the central member. Accordingly, the radius edges 172 and 174 of the respective entrance member 156 and exit member 160 (e.g., as illustrated in FIG. 5) are associated with the respective entrance radius 168 and exit radius 170 of the central member 190. The radius edges 172 and 174 may be in sliding contract or, in the alternative, near-contact with the respective entrance radius 168 and exit radius 170 of the central member 190 of FIG. 4, for example, wherein the rotation of the entrance member 156 and exit member 160 with respect to the central member generally rotates the respective pole edges 164 and 166, thus controlling the path 136 and focal point 142 of the desired ion beam 134 of FIG. 1. Furthermore, the entrance linkage 186 and exit linkage 188 of FIGS. 3, 4, and 5 are operably coupled to the respective entrance member 156 and exit member 160, wherein control of the rotation of the entrance and exit member(s) can be achieved by controlling the respective force applied thereto.

Figure 6:
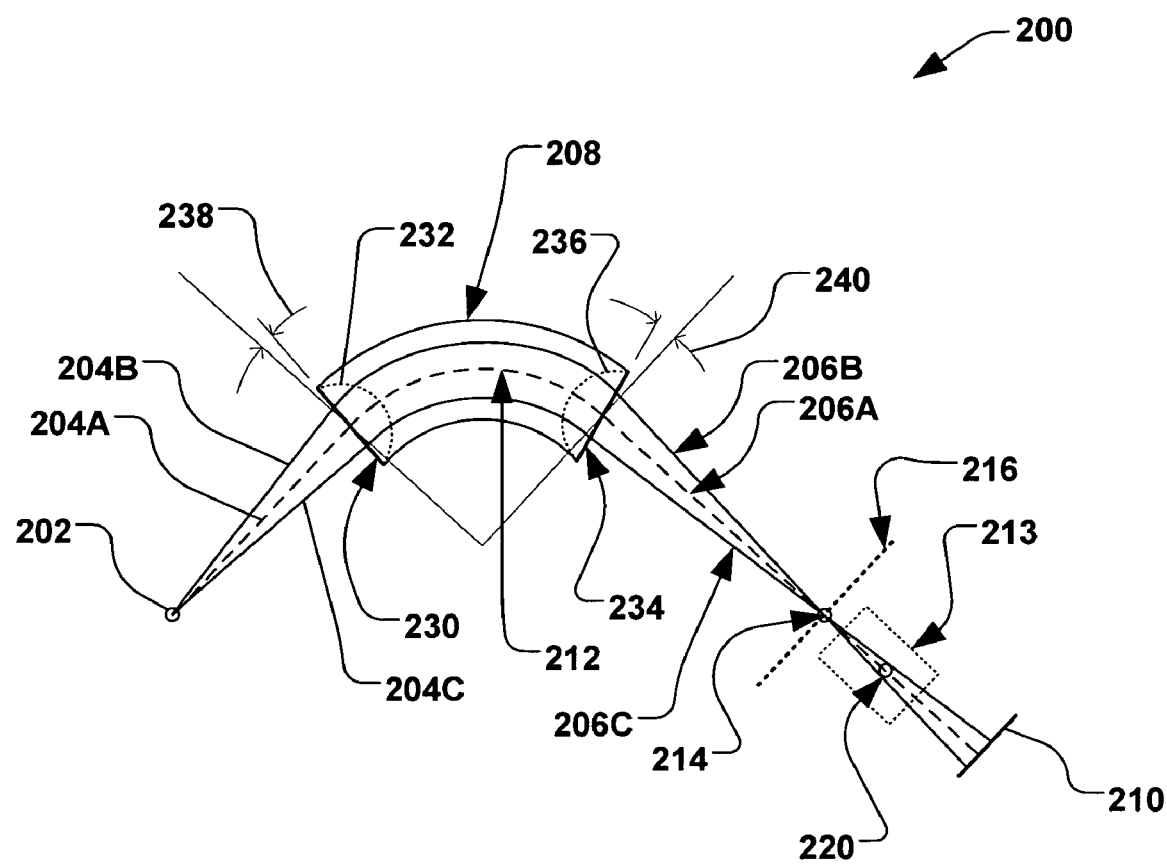
FIG. 6 is a schematic representation of an exemplary configuration of ion implanter optics in accordance with another aspect of the present invention.

Referring now to FIG. 6, a schematic representation of an exemplary configuration of ion implanter optics 200 is illustrated, wherein the exemplary pole rotation of the present invention may be implemented in order to tune the ion beam. As illustrated in FIG. 6, an ion source 202 is operable to produce a divergent ion beam 204 (represented by center 204A and edges 204B and 204C), wherein the divergent ion beam 204, for example, generally follows a path 206 (represented by a center path 206A and boundaries 206B and 206C) through a mass analysis magnet 208 toward a workpiece 210. A desired or nominal path 212, for example, is generally illustrated as the center path 206A. The boundary paths 206B and 206C of the ion beam 204, for example, can vary based on various factors, such as settings associated with the mass analysis magnet 208, as well as various other criteria and/or components common to ion implantation systems. Accordingly, the ion beam paths 206 ultimately converge at a focal point 214 generally defined at a focal point plane 216.

A mass resolving aperture 218 may be generally positioned at the focal plane 216, wherein the aperture is generally centered about the focal point 214. The mass resolving aperture 218, for example, further defines the current of the ion beam 204 passing through the aperture, wherein for high energy ion beams (e.g., tens of KeV), the space charge force is not very large, and the ion beam paths 206 converge at the illustrated focal point 214. However, for low energy ion beams 204 (e.g., hundreds of eV to several KeV), the ion beam paths (not shown) may generally converge at a low energy focal point 220 that is generally shifted from the focal point 214 and focal plane 216. As a result, the low energy beam 204 could lose part of its beam current at the designed aperture 218. In such instances, at least one of the rotation poles can be adjusted to change at least one of the pole rotation angles of 238 and 240. In this case, the low energy focal point 220 can be tuned back to the designed focal point position 214.

Figure 7A:
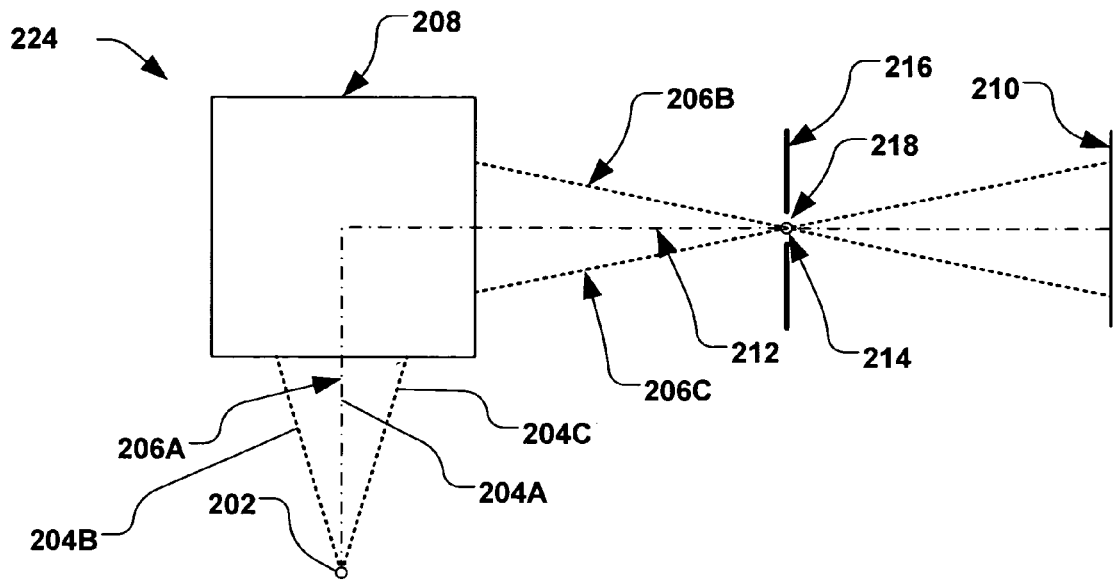
FIG. 7A is a schematic representation of an exemplary ion implanter operating in drift beam mode in accordance with the present invention.
Figure 7B:
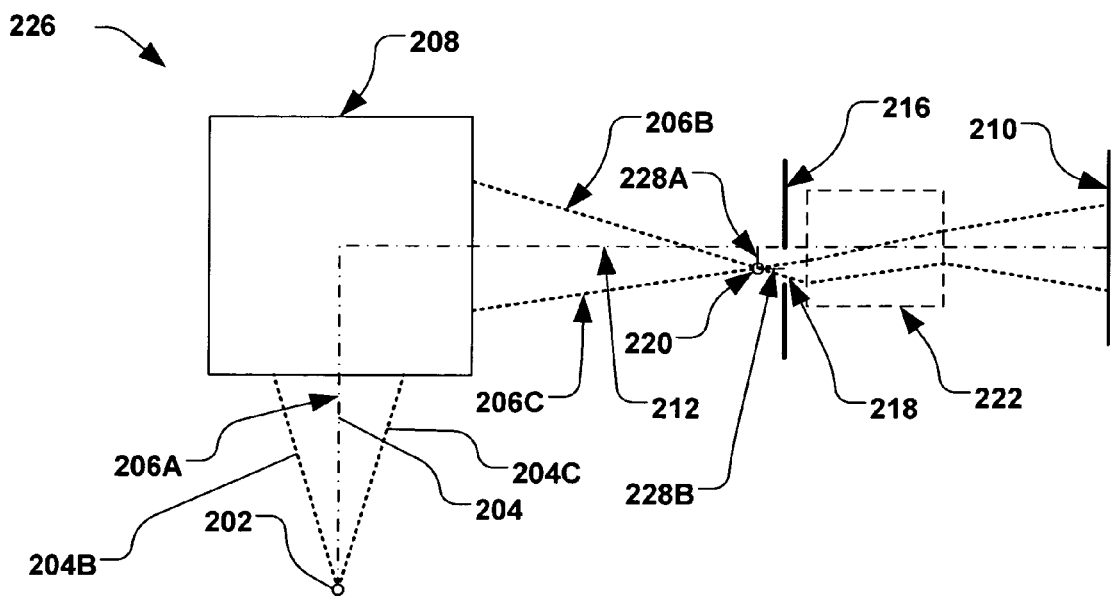
FIG. 7B is a schematic representation of an exemplary ion implanter operating in decel beam mode with an energy filter according to the invention.
Figure 7C:
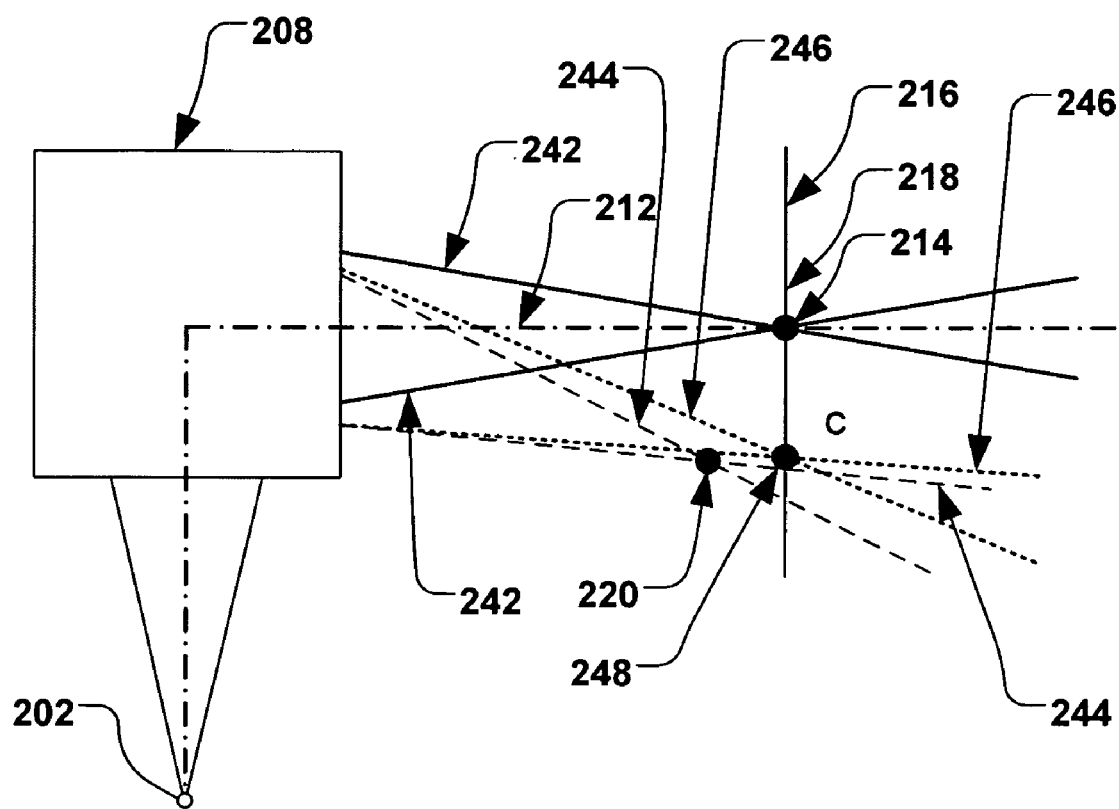
FIG. 7C is a schematic representation of an exemplary shift in focus of an ion beam in accordance with another aspect of the invention.

FIG. 7A-7C illustrate further exemplary implementations of the pole rotation of the present invention useful in tuning the ion beam. FIG. 7A, for example, illustrates a simplified schematic of an exemplary ion implanter operating in drift beam mode 224, wherein the focal point 214 of the ion beam 204 generally falls at the focal plane 216 associated with the resolving aperture 218. FIG. 7B, on the other hand, illustrates an exemplary ion implanter operating in decel beam mode 226 with an energy filter 222, wherein the focal point 220 is generally shifted by "de-tuning" the mass analysis magnet 208, thus providing respective offsets 228A and 228B from the nominal path 212 and the focal plane 216 associated with the resolving aperture 218. Accordingly, the resolving aperture 218 may be offset from the nominal path 212 to accommodate passage of the ion beam 204 therethrough for the decel beam mode 226 with energy filter 222, however, the focal point 220 generally no longer falls on the desired focal plant 216. In general, the offset 228A is desired for the purpose of energy filtering. The energy filter 222 attempts to bend the ion beam 204 back to the nominal path 212 in an attempt to correct the position offset. However, the offset 228B is generally not desired because the beam current could be significantly lost at the aperture 218. Accordingly, the pole rotation of the present invention can be utilized to correct the focal point offset 228B.

The present invention further advantageously controls the path 206 of the ion beam 204 of FIG. 6 by controlling a rotational position of a pole edge 230 of an entrance member 232 and a rotational position of a pole edge 234 of an exit member 236 with respect to the mass analyzer 208, thus further generally controlling a focusing of the ion beam to fall on the focal plane 216 for both drift beam mode and decel beam mode discussed above. The control of the rotational position of one or more of the entrance and exit members 232 and 236, for example, can be automated by theory and/or by detecting the ion beam 204 downstream of the mass analyzer 208 and rotating the entrance and/or exit members to attain an optimal beam current associated with the optical focal point 214 and/or focal point plane 216. Alternatively, the rotation of the entrance and/or exit members 232 and 236 can be performed manually by rotating the entrance and/or exit members to respective specified angles 238 and 240 with respect to the mass analyzer 208.

According to another example, FIG. 7C illustrates various ion beam paths 242, 244, and 246, wherein ion beam path 242 is associated with the drift beam mode 224 of FIG. 7A, while ion beam paths 244 and 246 are associated with the decel beam mode 226 of FIG. 7B. As illustrated, due, at least in part, to the de-tuning of the mass resolving magnet 208, the focal point 214 of the drift mode ion beam path 242 shifts to focal point 220 for the decel mode ion beam path 244, wherein the low energy focal point 220 no longer resides on the focal plane 216 of the resolving aperture 218, and beam current may be lost at the aperture. Accordingly, the present invention controls the rotational position of the pole edge 230 of the entrance member 232 and rotational position of the pole edge 234 of the exit member 236 of FIG. 6, the ion beam path 244 with its focal point 220 can then be tuned to be the ion beam path 246 with focal point 248 illustrated in FIG. 7C back to the focal plane 216 associated with the resolving aperture 218, thus substantially limiting potential beam current losses.

It should be noted that the present invention may be implemented with different schemes of decel mode and different schemes of "de-tuning" of the mass resolving magnet to shift the focus of the respective ion beams, and all such implementations are contemplated as falling within the scope of the present invention.

Figure 8:
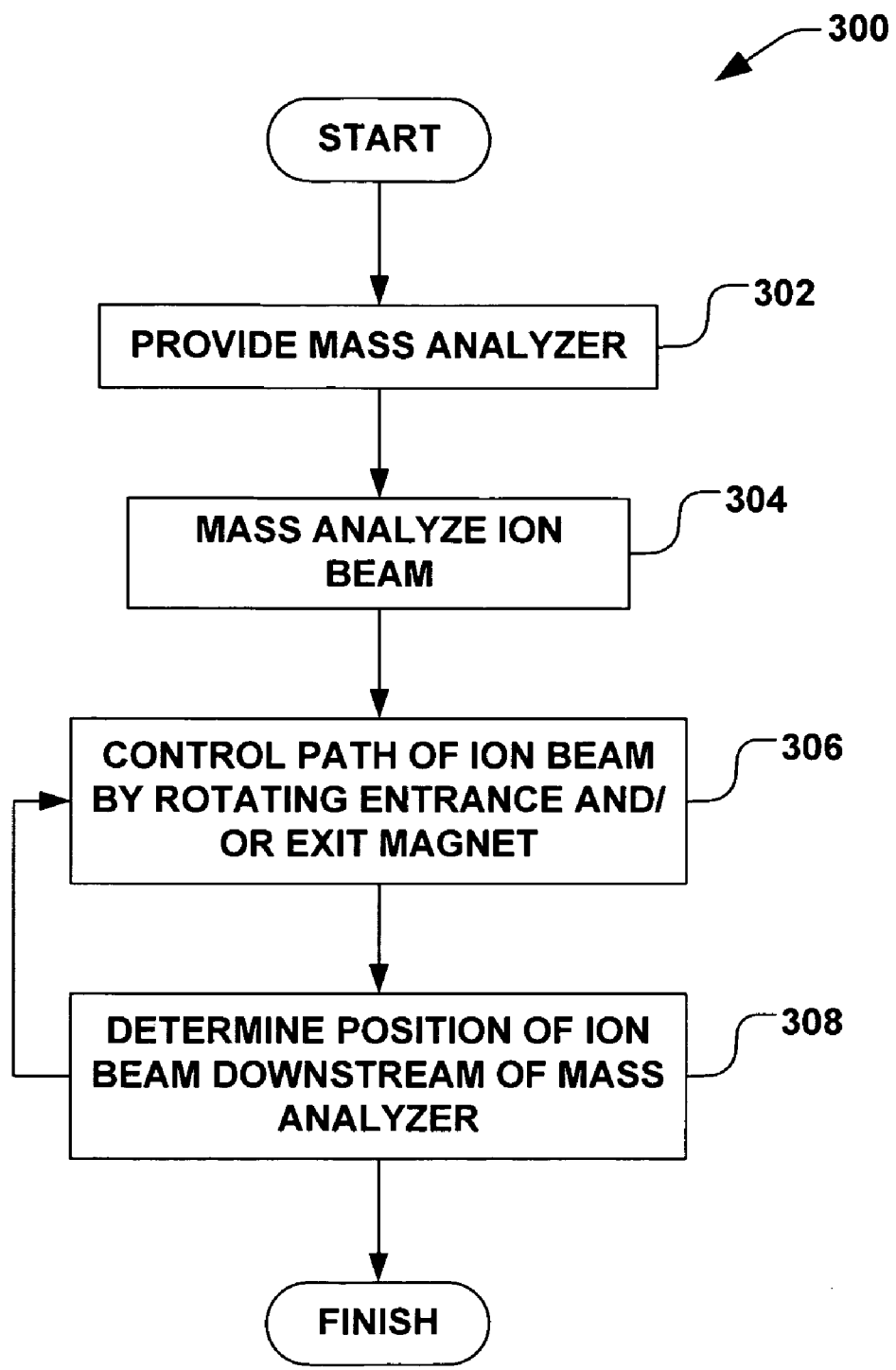
FIG. 8 is a block diagram of an exemplary method for controlling a path and focal point of an ion beam according to another exemplary aspect of the invention.

In accordance with still another aspect of the present invention, a method 300 for controlling a path of an ion beam is provided in FIG. 8. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 8, the method 300 begins with providing a mass analyzer for implanting ions into a workpiece in act 302, wherein the mass analyzer comprises an entrance pole mechanism positioned proximate to an entrance of the mass analyzer and an exit pole mechanism positioned proximate to the exit of the mass analyzer, such as the mass analyzer 124 of FIG. 1. In act 304 of FIG. 8, the ion beam is mass analyzed via the mass analyzer, wherein a desired ion beam is provided at the exit of the mass analyzer. In act 306, a path of the desired ion beam exiting the mass analyzer is selectively controlled by selectively rotating one or more of the entrance pole mechanism and exit pole mechanism, wherein a focal point of the desired ion beam is controlled. The desired ion beam, for example, may be accelerated or decelerated after exiting the mass analyzer, wherein the control of the path of the ion beam accounts for the acceleration or deceleration of the ion beam prior to impacting the workpiece.

According to another example, a position of the desired ion beam is determined at a position downstream of the exit of the mass analyzer in act 308, wherein the selective rotation of one or more of the entrance pole mechanism and exit pole mechanism is based, at least in part, on the determined position of the desired ion beam. The rotation of the entrance and/or exit members may be performed by automation, such as by a servo motor coupled to the respective entrance and/or exit members, or manually, wherein the control of the rotation is based on the determined position of the ion beam.

Accordingly, the present invention provides a greater degree of focusing accuracy for ion implantation systems, especially in systems where a de-tuning of the mass analyzer is performed, or when typical ion beam optics fail to provide adjustable focusing due space charges of the energy force. It should be further noted that although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
   an ion source configured to form a beam of undifferentiated ions;
   an end station having a workpiece associated therewith;
   a mass analyzing magnet generally positioned between the ion source and the end station and configured to select a desired beam of ions having a path and a focal point associated therewith, wherein the undifferentiated ion beam generally enters the mass analysis magnet at an entrance thereof, and wherein the desired ion beam exits the mass analysis magnet at an exit thereof, and wherein the mass analysis magnet further comprises one or more of an entrance pole mechanism adjustably positioned proximate to the entrance of the mass analysis magnet and an exit pole mechanism adjustably positioned proximate to the exit of the mass analysis magnet, wherein the position of at least one of the entrance pole mechanism and exit pole mechanism generally determines the path and focal point of the desired ion beam; and
   a controller configured to selectively position one or more of the entrance pole mechanism and exit pole mechanism, therein generally controlling the path of the desired ion beam at the exit of the mass analysis magnet.

2. The in implantation system of claim 1, wherein one or more of the entrance pole mechanism and exit pole mechanism are rotatably positioned proximate to the respective entrance and exit of the mass analysis magnet, and wherein the controller is configured to control the rotational position of the respective entrance pole mechanism and exit pole mechanism.

3. The ion implantation system of claim 1, further comprising a detection device associated with the path of the desired ion beam, wherein the detection device is configured to detect one or more characteristics of the desired ion beam, and wherein the controller is further configured to selectively position one or more of the entrance pole mechanism and exit pole mechanism based, at least in part, on the detected one or more characteristics of the desired ion beam.

4. The ion implantation system of claim 3, wherein the one or more characteristics of the desired ion beam comprise one or more of a position of the desired ion beam and a current of the desired ion beam.

5. The ion implantation system of claim 4, wherein the detection device comprises a faraday cup configured to generally translate through the path of the desired ion beam, therein generally detecting the position of the desired ion beam.

6. The ion implantation system of claim 4, wherein the detection device comprises a generally stationary faraday cup positioned along the path of the desired ion beam.

7. The ion implantation system of claim 1, wherein the entrance pole mechanism comprises an entrance member positionable with respect to an entrance axis and the exit pole mechanism comprises an exit member positionable with respect to an exit axis, wherein a generally stationary central member is generally disposed between the entrance member and exit member, wherein the entrance member and exit member each comprise a pole edge positionable with respect to the respective entrance axis and exit axis, and wherein a position of one or more of the entrance member and exit member with respect to the respective entrance axis and exit axis generally defines the path and focal point of the desired ion beam.

8. The ion implantation system of claim 7, wherein the entrance member, exit member, and central member generally define a magnetic pole of the mass analysis magnet.

9. The ion implantation system of claim 7, wherein one or more of the entrance member and exit member is rotatable with respect to the central member about the respective entrance axis and exit axis.

10. The ion implantation system of claim 7, wherein the central member further comprises an entrance radius and an exit radius, and wherein the entrance member comprises a radius edge associated with the entrance radius, and the exit member comprises a radius edge associated with the exit radius.

11. The ion implantation system of claim 10, wherein one or more of the entrance member and exit member are generally semicircular in shape.

12. The ion implantation system of claim 7, wherein the entrance member is operably coupled to the mass analysis magnet via an entrance linkage, and wherein the exit member is operably coupled to the mass analysis magnet via an exit linkage, wherein the entrance linkage and exit linkage are configured to position the entrance member and exit member with respect to a central member disposed therebetween via a respective application of force thereto.

13. The ion implantation system of claim 12, wherein one or more of the entrance member and exit member is rotatably coupled to the mass analysis magnet via the respective entrance linkage and exit linkage.

14. The ion implantation system of claim 12, further comprising one or more servo motors operably coupled to one or more of the entrance linkage and exit linkage.

15. The ion implantation system of claim 1, further comprising one or more of an aperture, an energy filter, an acceleration device, and a deceleration device positioned along the path of the ion beam, wherein the respective aperture, energy filter, acceleration device, and deceleration device are operable to alter the path of the ion beam, and wherein the controller is further configured to selectively position one or more of the entrance pole mechanism and exit pole mechanism, therein generally controlling the path and focal point of the desired ion beam at the workpiece.

16. A mass analyzer, comprising:
a mass analysis magnet; and
one or more of a selectively positionable entrance pole mechanism proximate to an entrance of the mass analysis magnet and a selectively positionable exit pole mechanism proximate to an exit of the mass analysis magnet, wherein a path of ions exiting the mass analyzer is generally determined by a position of one or more of the entrance pole mechanism and exit pole mechanism.

17. The mass analyzer of claim 16, wherein the entrance pole mechanism comprises an entrance member rotatable about an entrance axis and the exit pole mechanism comprises an exit member rotatable about an exit axis.

18. The mass analyzer of claim 17, wherein the entrance member is rotatably coupled to the mass analysis magnet via an entrance linkage, and wherein the exit member is rotatably coupled to the mass analysis magnet via an exit linkage, wherein the entrance linkage and exit linkage are configured to rotate the entrance member and exit member about the respective entrance axis and exit axis via a respective application of force thereto.

19. The mass analyzer of claim 18, further comprising one or more servo motors operably coupled one or more of the entrance linkage and exit linkage.

20. The mass analyzer of claim 18, wherein each of the entrance member and exit member comprise a pole edge rotatable about the respective entrance axis and exit axis, and wherein a rotation of the entrance member and exit member about the respective entrance axis and exit axis generally defines the path of the ions at the exit of the mass analyzer.

21. The mass analyzer of claim 20, wherein the mass analysis magnet further comprises an entrance radius and an exit radius, and wherein the entrance member and exit member further comprise a radius edge generally opposite the respective pole edge, wherein the radius edge of the entrance member and exit member is associated with the respective entrance radius and exit radius of the mass analyzer.

22. The mass analyzer of claim 21, wherein the respective radius edge of the entrance member and exit member is separated from the respective entrance radius and exit radius of the mass analyzer by a predetermined distance.

23. The mass analyzer of claim 17, wherein one or more of the entrance member and exit member are generally semicircular in shape.

24. A method for controlling a path of an ion beam, the method comprising:
providing a mass analyzer having one or more of an entrance pole mechanism positioned proximate to the entrance of the mass analyzer and an exit pole mechanism positioned proximate to the exit of the mass analyzer;
mass analyzing the ion beam, therein providing a desired ion beam at the exit of the mass analyzer; and
selectively positioning one or more of the entrance pole mechanism and exit pole mechanism, therein selectively augmenting a path of the desired ion beam exiting the mass analyzer.

25. The method of claim 24, further comprising accelerating or decelerating the desired ion beam after the desired ion beam exits the mass analyzer.

26. The method of claim 24, further comprising determining a position of the desired ion beam at a position downstream of the exit of the mass analyzer, wherein the selective positioning of one or more of the entrance pole mechanism and exit pole mechanism is based, at least in part, on the determined position of the desired ion beam.

27. The method of claim 24, wherein the entrance pole mechanism comprises an entrance member and the exit pole mechanism comprises an exit member, wherein the selective positioning of one or more of the entrance pole mechanism and exit pole mechanism comprises rotating one or more of the respectively entrance member and exit member.

28. The method of claim 24, wherein the ion beam comprises a low energy beam having a focal point being offset from a nominal focal point plane thereof, and wherein selectively positioning one or more of the entrance pole mechanism and exit pole mechanism shifts the focal point of the ion beam onto the nominal focal point plane.

29. The method of claim 24, wherein the mass analyzer is configured to operate in decel mode with an energy filter, wherein the mass analyzer is generally de-tuned and a focal point of the ion beam is generally offset from a nominal focal point plane thereof, and wherein selectively positioning one or more of the entrance pole mechanism and exit pole mechanism shifts the focal point of the ion beam onto the nominal focal point plane.

* * * * *